US012615981B2

(12) United States Patent
Kwak et al.

(10) Patent No.: US 12,615,981 B2
(45) Date of Patent: Apr. 28, 2026

(54) METHOD FOR ETCHING SILICON-CONTAINING FILM AND SEMICONDUCTOR DEVICE MANUFACTURING METHOD COMPRISING SAME

(71) Applicants:SK SPECIALTY CO., LTD, Yeongju-si (KR); KWANGWOON UNIVERSITY INDUSTRY-ACADEMIC COLLABORATION FOUNDATION, Seoul (KR)

(72) Inventors: Jung Hun Kwak, Yeongju-si (KR); Byung Hyang Kwon, Yeongju-si (KR); Yong Jun Cho, Yeongju-si (KR); Gi Chung Kwon, Seongnam-si (KR); Woo Jae Kim, Seoul (KR)

(73) Assignees: SK SPECIALTY CO., LTD, Yeongju-si (KR); KWANGWOON UNIVERSITY INDUSTRY-ACADEMIC COLLABORATION FOUNDATION, Seoul (KR)

( * ) Notice: Subject to any disclaimer, the term of this patent is extended or adjusted under 35 U.S.C. 154(b) by 260 days.

(21) Appl. No.: 18/039,155

(22) PCT Filed: Nov. 11, 2021

(86) PCT No.: PCT/KR2021/016462
§ 371 (c)(1),
(2) Date: May 26, 2023

(87) PCT Pub. No.: WO2022/124604
PCT Pub. Date: Jun. 16, 2022

(65) Prior Publication Data
US 2023/0420261 A1 Dec. 28, 2023

(30) Foreign Application Priority Data

Dec. 9, 2020 (KR) ........................ 10-2020-0171746

(51) Int. Cl.
| | |
|---|---|
| *H10P 50/28* | (2026.01) |
| *H10P 14/692* | (2026.01) |
| *H10P 14/694* | (2026.01) |

(52) U.S. Cl.
CPC ...... *H10P 50/283* (2026.01); *H10P 14/69215* (2026.01); *H10P 14/69433* (2026.01)

(58) Field of Classification Search
None
See application file for complete search history.

(56) References Cited

U.S. PATENT DOCUMENTS

| | | | | |
|---|---|---|---|---|
| 6,376,386 B1 * | 4/2002 | Oshima | ............. | H01L 21/31116 |
| | | | | 257/E21.654 |
| 2003/0143846 A1 | 7/2003 | Sekiya et al. | | |
| 2019/0206696 A1 * | 7/2019 | Hsu | ................... | H01L 21/32135 |

FOREIGN PATENT DOCUMENTS

| | | |
|---|---|---|
| KR | 10-1998-0071698 A | 10/1998 |
| KR | 10-2017-0042044 A | 4/2017 |

(Continued)

OTHER PUBLICATIONS

International Search Report for PCT/KR2021/016462 mailed Feb. 22, 2022 from Korean Intellectual Property Office.

(Continued)

*Primary Examiner* — Roberts P Culbert
(74) *Attorney, Agent, or Firm* — Paratus Law Group, PLLC

(57) ABSTRACT

There is provided a method for etching a silicon-containing film. The method includes: introducing a substrate having a first silicon-containing film and a second silicon-containing film into a process chamber of an etching apparatus; sup- (Continued)

plying at least one etching gas including $F_3NO$ into the process chamber; applying a predetermined power to the process chamber maintained at a predetermined pressure to generate direct plasma in the process chamber; and etching the first silicon-containing film on the substrate by reactive species (radicals) of the etching gas activated by the direct plasma. The predetermined pressure is set within a predetermined range in which the slope of the etch rate of the first silicon-containing film with respect to the pressure differs from the slope of the etch rate of the second silicon-containing film with respect to the pressure in terms of sign.

9 Claims, 6 Drawing Sheets

(56)                References Cited

FOREIGN PATENT DOCUMENTS

| | | |
|---|---|---|
| KR | 10-2018-0030430 A | 3/2018 |
| KR | 10-2018-0068290 A | 6/2018 |
| KR | 10-2010466 B1 | 8/2019 |

OTHER PUBLICATIONS

Minsu Choi et al., "Characterization of $SiO_2$ Plasma Etching with Perfluorocarbon ($C_4F_8$ and $C_6F_6$) and Hydrofluorocarbon ($CHF_3$ and $C_4H_2F_6$) Precursors for the Greenhouse Gas Emissions Reduction", Materials, Aug. 14, 2023, pp. 1-18, vol. 16, No. 5624.

* cited by examiner

METHOD FOR ETCHING SILICON-CONTAINING FILM AND SEMICONDUCTOR DEVICE MANUFACTURING METHOD COMPRISING SAME

CROSS-REFERENCE TO PRIOR APPLICATIONS

This application is a National Stage Patent Application of PCT International Patent Application No. PCT/KR2021/016462 (filed on Nov. 11, 2021) under 35 U.S.C. § 371, which claims priority to Korean Patent Application No. 10-2020-0171746 (filed on Dec. 9, 2020), which are all hereby incorporated by reference in their entirety.

BACKGROUND

The present invention relates to a method for etching a silicon-containing film and a method for manufacturing a semiconductor device including the same, and more particularly, to a method for etching a silicon-containing film by direct plasma using an etching gas including $F_3NO$, and a method for manufacturing a semiconductor device including the etching method.

Generally, a series of processes, such as deposition, etching, cleaning, etc. are performed to manufacture a semiconductor device on a substrate. These processes are performed in a deposition apparatus (for example, a CVD apparatus), an etching apparatus, or a cleaning apparatus, each of which has a process chamber. The etching process is a process of forming a desired ultra-fine structure by selectively removing a portion of a thin film deposited on the substrate by a deposition process or the like.

In the etching process, in particular, in a dry etching process, an etching gas reacts with the thin film to be etched, for example, a silicon-containing film to form a reaction product having strong volatility, thereby removing a portion of the thin film. In order to further increase reactivity between the etching gas and the thin film to be etched, an etching method using plasma is largely employed. Plasma makes the etching gas into reactive species or radicals having high reactivity with the film.

In the dry etching using plasma, direct plasma technology implemented by capacitive coupled plasma (CCP) technology or inductive coupled plasma (ICP) technology is employed. Here, the direct plasma technology or the direct plasma refers to a technology of directly generating plasma in the process chamber which is a space where the substrate is processed, or the generated plasma itself. In addition, the CCP technology is generally used in a plasma etching (PE) method, a plasma enhanced chemical vapor deposition (PECVD) method, a reactive ion etching (RIE) method, or a reactive ion chemical vapor deposition method, and the ICP technology is generally used in generating a remote plasma (RP) and a direct ICP plasma (using plasma sources such as Helical, TCP, ECR, Helicone plasma sources).

In the etching process, a film to be etched should be etched in a high rate, whereas a film not to be etched should be etched in a low rate, but in the case of etching using direct plasma, there is a limitation in improving an etching selectivity.

In addition, the etching gas used in the etching process is required not to generate a harmful waste gas after the etching process and to be eco-friendly.

As conventional etching gases, perfluorinated compound gases such as $CF_4$, $C_2F_6$, $SF_6$, and $NF_3$, have been largely used. However, the conventional perfluorinated compound etching gases are difficult to process waste gases generated after the etching process, and accordingly, it takes a large processing cost to reduce it to an acceptable level before discharging it into the atmosphere. In addition, the conventional perfluorinated compound etching gases are stable compounds with a long lifespan in the atmosphere, and have a very high global warming potential, so they are pointed out as a major factor in global warming.

Accordingly, there is a need for an alternative etching gas having a low global warming potential and excellent etching performance with respect to a silicon-containing film, and as a candidate etching gas, $F_3NO$ which is disclosed in Patent Document 1 is known.

DESCRIPTION OF THE PRIOR ART

Patent Literature (Patent Literature 1) KR Registered Patent No. 10-2010466

SUMMARY

The objective of the present invention is to provide a method for etching a silicon-containing film at a high selectivity by activating an etching gas including eco-friendly $F_3NO$ having a relatively low global warming potential by direct plasma, and a method for manufacturing a semiconductor device including the same.

A method for etching a silicon-containing film according to an aspect of the present invention comprises steps of: introducing a substrate including a first silicon-containing film and a second silicon-containing film into a process chamber of an etching apparatus, supplying at least one etching gas including $F_3NO$ to the process chamber, generating a direct plasma in the process chamber by applying a predetermined power to the process chamber maintained at a predetermined pressure, and etching the first silicon-containing film on the substrate by radicals of the etching gas activated by the direct plasma, wherein the predetermined pressure is set to be in a predetermined range in which a slope of etch rate of the first silicon-containing film with respect to pressure has a different sign from a slope of etch rate of the second silicon-containing layer with respect to pressure.

According to a preferred embodiment of the present invention, the first silicon-containing film is a silicon nitride film, and the second silicon-containing film is a silicon oxide film.

According to another preferred embodiment of the present invention, the predetermined pressure is set to a value greater than the median value of the predetermined range in which the slope of etch rate of the silicon nitride film with respect to pressure is positive, and the slope of etch rate of the silicon oxide film with respect to pressure is negative.

According to another preferred embodiment of the present invention, the predetermined pressure ranges from 1 mTorr 10 Torr, and more preferably, 200 mTorr to 270 mTorr.

According to another preferred embodiment of the present invention, the predetermined power ranges from 10 W to 50,000 W, and more preferably 240 W to 320 W.

According to another aspect of the present invention, a method for manufacturing a semiconductor device comprises steps of: forming a silicon-containing film including a first silicon-containing film and a second silicon-containing film on a substrate, and etching the silicon-containing film using the method for etching the silicon-containing film according to the aspect of the present invention.

According to the present invention, it is possible to etch a silicon-containing film such as a silicon nitride film with a high selectivity by controlling pressure and power for direct plasma generation while using an etching gas including eco-friendly $F_3NO$.

DETAILED DESCRIPTION

Figure 1A:
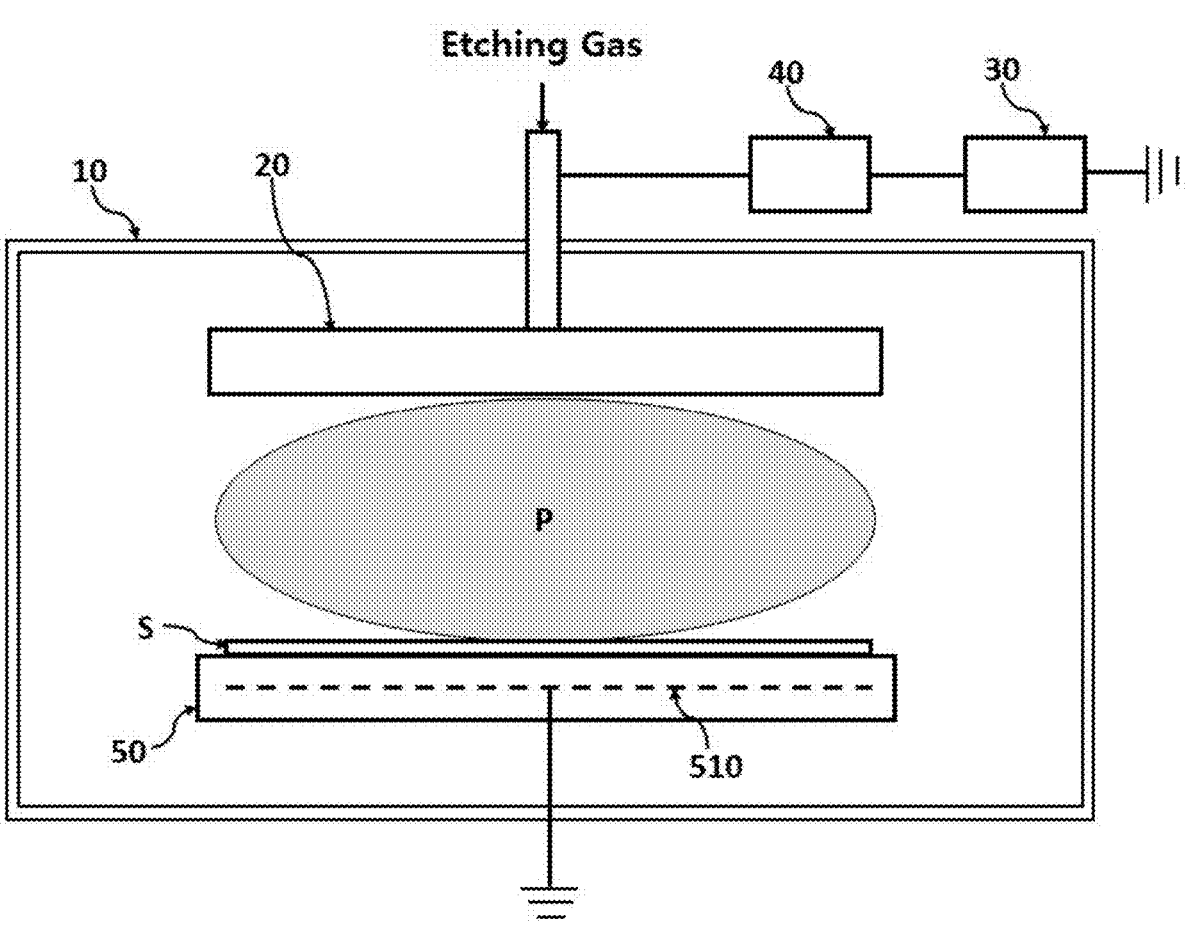
FIGS. 1A and 1B are schematic diagrams of an etching apparatus for performing an etching method according to an embodiment of the present invention.

Hereinafter, exemplary embodiments of the present invention will be described in detail with reference to the accompanying drawings. The same reference numerals refer to the same elements in the drawings, and repeated descriptions thereof will be omitted.

Figure 1B:
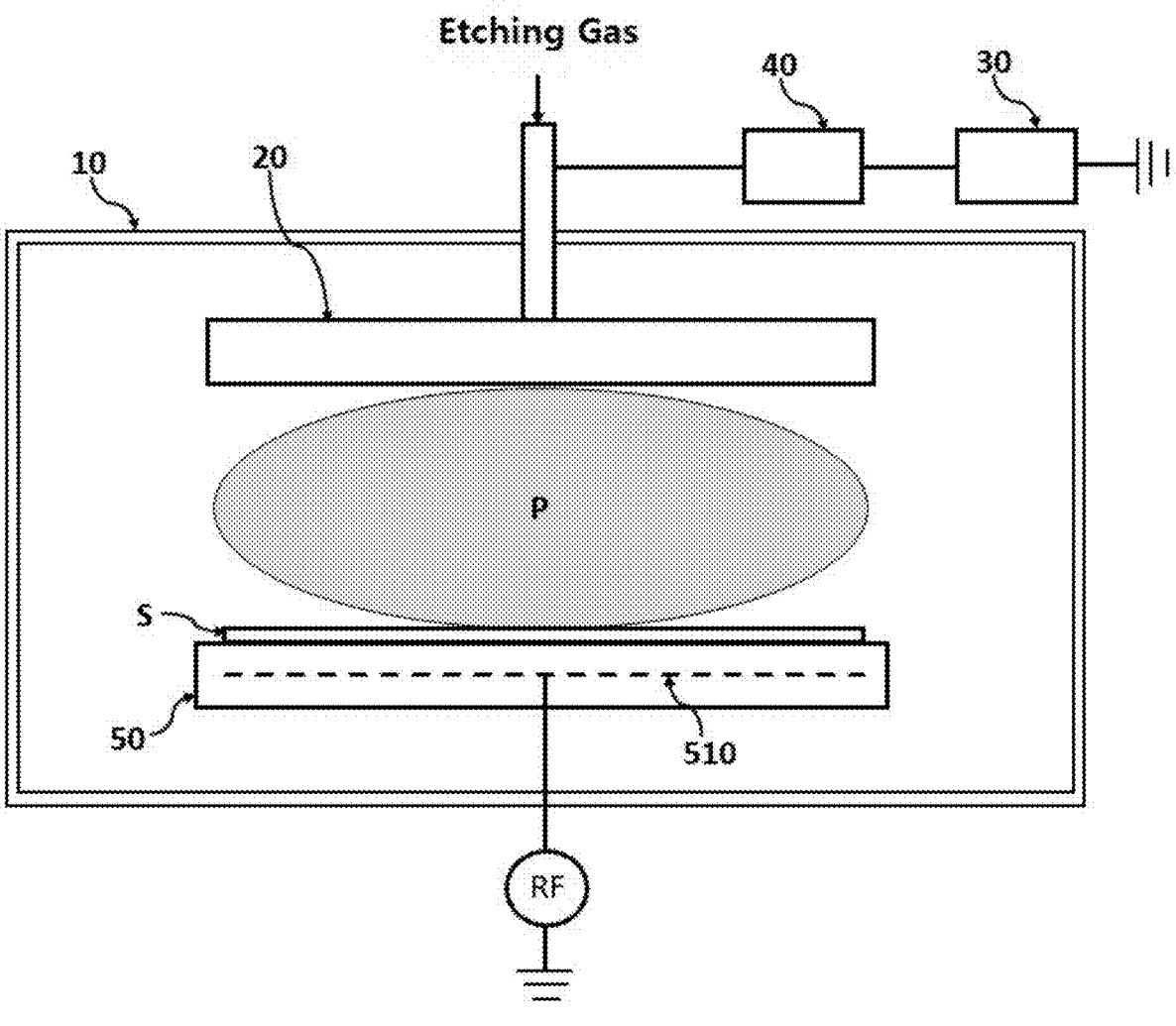

FIGS. 1A and 1B illustrate an etching apparatus 1 for performing an etching method according to an embodiment of the present invention.

The etching apparatus 1 is a capacitively coupled plasma apparatus capable of generating a direct plasma, and the plasma P is directly generated in a process chamber 10 of the etching apparatus 1 through plasma discharge.

To this end, the etching apparatus 1 includes a shower head 20 serving as an electrode and an RF power supply connected to the shower head 20, and the RF power supply includes an RF generator 30 and an impedance matching network (IMN) 40.

The shower head 20 of the etching apparatus 1 is disposed in an upper part inside the process chamber 10 and is used to supply an etching gas or a control gas into the process chamber 10.

The RF generator 30 generates RF power, and the impedance matching network 40 stabilizes plasma by adjusting impedance.

As shown in FIGS. 1A and 1B, the etching apparatus 1 includes a stage 50, which holds and supports a substrate S to be processed, in a lower part inside the process chamber 10. The stage 50 of the etching apparatus 1 is grounded, serving as a ground electrode. A heating wire 510 or a heater electrode may be provided inside the stage 50 to adjust temperature of the substrate S. Further, although not shown in FIGS. 1A and 1B, the stage 50 may include a fixing means (for example, an electrostatic chuck) capable of fixing the substrate S during an etching process.

When RF power of a predetermined magnitude is applied to the shower head 20 in a state in which the stage 50 is grounded, a strong alternating electric field is generated between the shower head 20 and the stage 50 to generate a plasma P. In a case of a direct CCP etching apparatus, concentrations of reactive species can be increased by increasing the power applied by the RF power supply, and the etch rate can be increased.

When the plasma P is generated, radicals R, ions, electrons, and ultraviolet may be generated from the etching gas. At least one of the radicals R, the ions, and the electrons may be used in the etching process. Fundamentally, the radicals R are electrically neutral, and the ions are electrically charged. Accordingly, when the plasma P is used in the etching process, the radicals R are used for isotropic etching of an object to be etched, and the ions are used for anisotropic etching the object to be etched.

Although the etching apparatus 1 of FIG. 1A has a configuration that the shower head 20 is connected to the RF power supply, but the etching apparatus 1 is not limited thereto, and another RF power supply may be additionally connected to the stage 50, as shown in FIG. 1B, in order to perform etching by physical collisions of the ions in the plasma as well as chemical etching by the radicals R.

In addition, the etching apparatus 1 according to the present embodiment may have a configuration in which an ICP apparatus is combined. In this case, a coil antenna may be disposed in the etching apparatus 1, and an RF power source may be connected to the coil antenna. In addition, the etching apparatus 1 according to the present embodiment may have a configuration in which a remote plasma apparatus is coupled.

Figure 2:
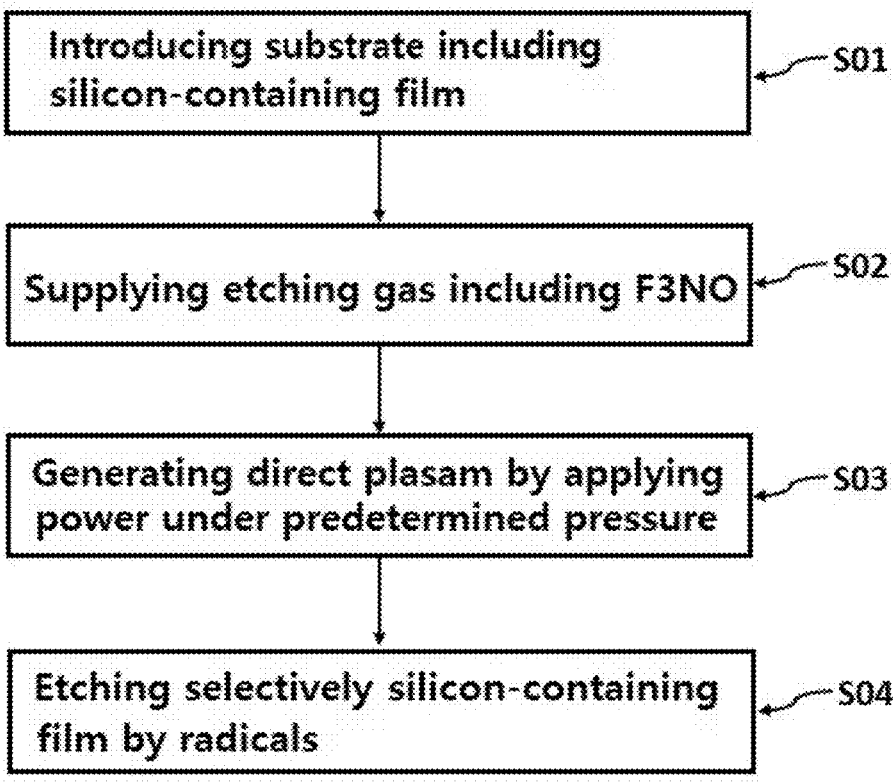
FIG. 2 is a flowchart of an etching method according to an embodiment of the present invention.

FIG. 2 is a flowchart of an etching method using direct plasma according to an embodiment of the present invention.

Referring to FIG. 2, in the etching method using direct plasma according to the present embodiment, a substrate S on which a silicon-containing film is formed is introduced into the process chamber 10 of the etching apparatus 1 through a gate valve that is not illustrated, and the substrate S is placed on the stage 50 of the etching apparatus 1 (S01). The silicon-containing film formed on the substrate S includes at least a silicon nitride film (a first silicon-containing film) and a silicon oxide film (a second silicon-containing film). However, the etching method of the present invention is not limited thereto, and the silicon-containing film may include other silicon-containing films (for example, polysilicon, silicide film, etc.).

Then, an etching gas including $F_3NO$ is supplied into the process chamber 10 through the shower head 20 (S02). In this case, a control gas (for example, $H_2O$, $H_2$, HBr, etc.) may be additionally supplied in addition to $F_3No$. When the control gas containing a hydrogen atom is mixed, the concentrations of the reactive species generated in the direct plasma of $F_3No$ can be adjusted, thereby adjusting the etching selectivity of the silicon-containing film to be etched. In addition, when etching by a physical collision is to be performed together (for example, reactive ion etching), an inert gas such as Ar may be additionally supplied. When Ar is mixed, the ion collision increases to improve the etching rate and anisotropy of the physical etching, and the $Ar^+$ ion beam breaks bonds between silicon atoms of the silicon-containing film to lower the activation energy for the reaction with the reactive species of the etching gas, thereby improving the chemical etching rate by the reactive species. In the case of a conventional perfluoro-etching gas such as $CF_4$ or $NF_3$, $O_2$ may be mixed in order to increase the concentrations of F-reactive species and thereby to increase the etching rate. However, in the etching method of the present invention, $F_3NO$ is used as the main etching gas, so that the etching rate can be sufficiently increased without separately mixing $O_2$.

Next, direct plasma is generated in the process chamber 10 (S03) by applying an appropriate power to the RF generator 30 of the etching apparatus 1 under appropriate pressure and temperature conditions. As is described below with reference to FIGS. 3 to 5, according to the etching method pertaining to an embodiment of the present invention, the etching selectivity of the silicon nitride film with respect to the silicon oxide film can be maximized by adjusting the pressure and the applied power when direct plasma of the etching gas containing $F_3NO$ is generated. In an embodiment of the present invention, since $F_3NO$ is used as the etching gas, reactive species such as F, $F_2$, FNO, and NO are generated in the direct plasma generated in the process chamber 10.

The reactive species in the direct plasma generated in the process chamber 10 react with the silicon-containing film on the substrate S mounted on the stage 50 to selectively etch the silicon-containing film to be etched (S04). According to the etching method of the embodiment of the present invention, the silicon nitride film may be etched with a high selectivity with respect to the silicon oxide film.

The substrate S on which the etching process is completed is carried out of the process chamber 10 and is then transferred to the next process.

Hereinafter, with reference to FIGS. 3 to 5, etch rate and etching selectivity of the silicon-containing film as functions of pressure and applied power for the direct plasma generation of the etching gas containing $F_3NO$ will be described.

Figure 3:
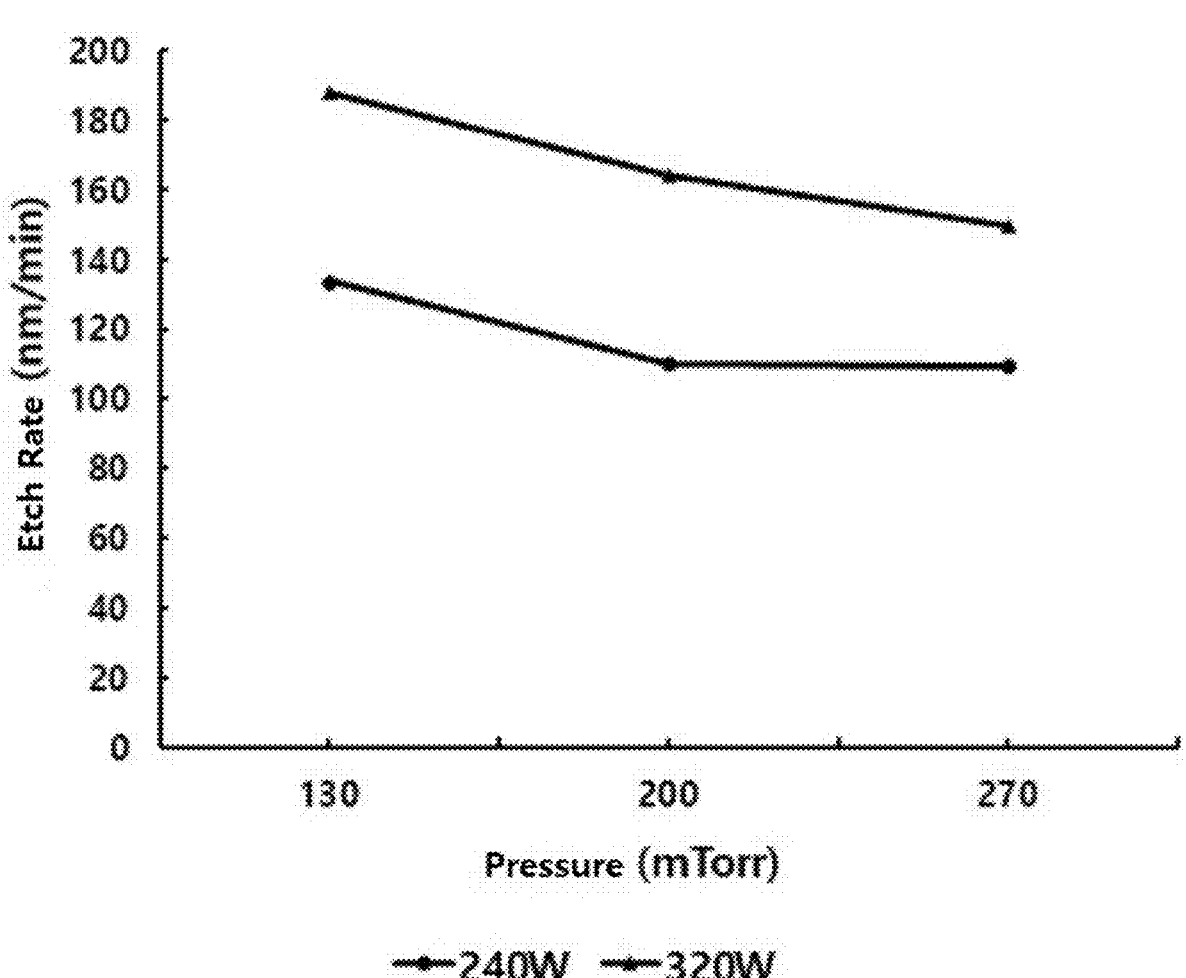
FIG. 3 is a graph illustrating an etch rate of a silicon oxide film with respect to pressure and applied power.
Figure 4:
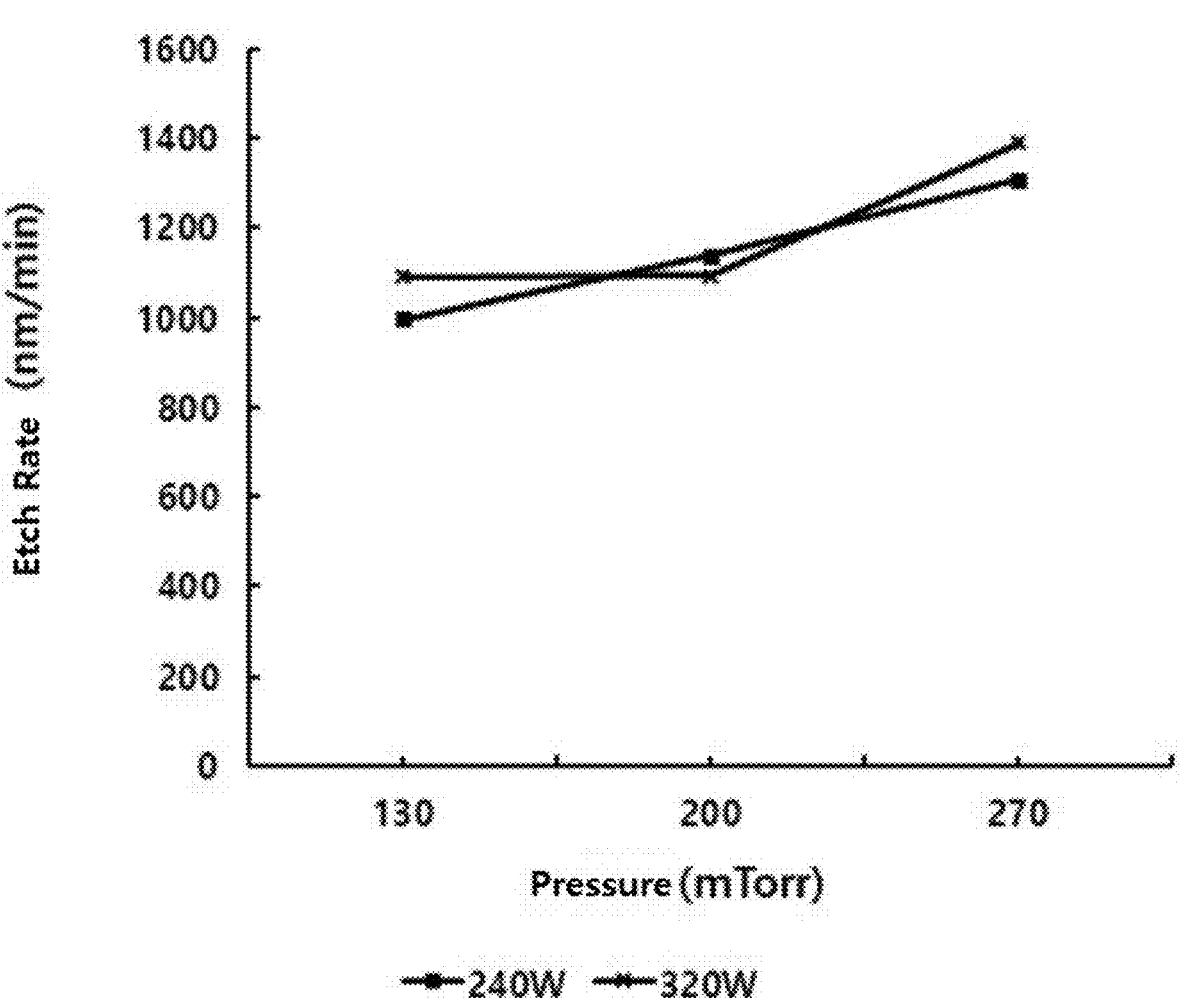
FIG. 4 is a graph illustrating an etch rate of a silicon nitride film with respect to pressure and applied power.

FIG. 3 is a graph illustrating an etch rate of a silicon oxide film ($SiO_2$) with respect to pressure and applied power in case a direct plasma is generated while flowing $F_3NO$ having a purity of 99.99% into the etching apparatus 1 at a flow rate of 120 sccm in the direct plasma generation step S03, and FIG. 4 is a graph illustrating an etch rate of a silicon nitride film (SiNx) with respect to pressure and applied power in case a direct plasma is generated under the same conditions as in FIG. 3 in the direct plasma generation step S03.

Figure 5:
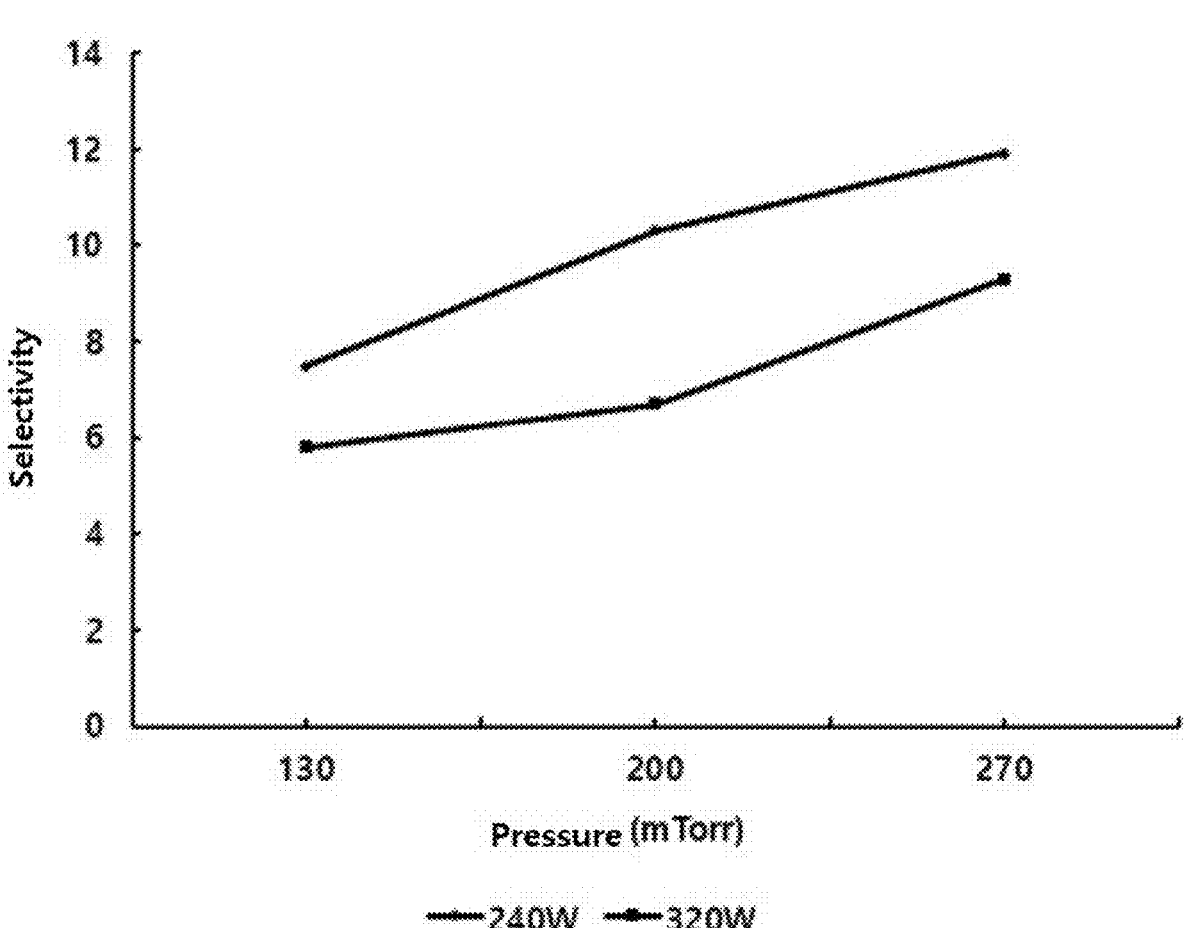
FIG. 5 is a graph illustrating etch selectivity of a silicon nitride film with respect to a silicon oxide film as a function of pressure and applied power.

FIG. 5 shows an etching selectivity of the silicon nitride film with respect to the silicon oxide film over pressure and applied power in the direct plasma generation step S03.

As shown in FIG. 3, in the etching of the silicon oxide film by the direct plasma of the etching gas containing $F_3NO$, the etch rate decreases with increase of the pressure in the process chamber 10. That is, in FIG. 3, the slope (tangential slope) of the etch rate graph with respect to pressure is negative. Accordingly, as the pressure increases, the etching rate of the silicon oxide film by the direct plasma of the etching gas including the $F_3NO$ decreases.

For example, in case the applied power in the direct plasma generation is 240 W, as the pressure for generation of the direct plasma increases up to 200 mTorr, the etch rate of the silicon oxide film decreases by about 18% compared to the case where the pressure is 130 mTorr. As the pressure during the direct plasma generation further increases up to 270 mTorr, the etch rate of the silicon oxide film decreases further, but the absolute value of the slope of the graph decreases.

In case the applied power during the direct plasma generation of the etching gas including the $F_3NO$ is increased to 320 W, the overall etch rate becomes higher compared to the case in which the power is 240 W because the concentrations of reactive species increases, and the etch rate of the silicon oxide film decreases as the pressure during the direct plasma generation increases, and thus the slope of the graph of the etch rate with respect to pressure is negative similarly in the case of 240 W.

Meanwhile, as shown in FIG. 4, in the etching of the silicon nitride film by the direct plasma of the etching gas containing $F_3NO$, the etch rate of the silicon nitride film increases in proportion to the pressure during the direct plasma generation, unlike the etch rate behavior of the silicon oxide film. That is, unlike the graph of FIG. 3, the slope (tangential slope) of the etch rate graph with respect to pressure in FIG. 4 is positive. Accordingly, as the pressure during the direct plasma generation increases, the etch rate of the silicon nitride film by the direct plasma of the etching gas including $F_3NO$ increases.

For example, in case the applied power during the direct plasma generation is 240 W, as the pressure during the direct plasma generation increases up to 200 mTorr, the etch rate of the silicon nitride film increases by about 14% compared to the case where the pressure condition is 130 mTorr. As the pressure further increases up to 270 mTorr, the etch rate of the silicon nitride film further increases by about 15% compared to the case of 200 mTorr.

In case the applied power during the direct plasma generation is increased to 320 W, unlike the behavior of the etch rate of the silicon oxide film, the etch rate of the silicon nitride film itself does not change significantly compared to the case where the applied power is 240 W. However, as in the case where the applied power is 240 W, as the pressure during the direct plasma generation increases, the etch rate of the silicon nitride films increases in overall, and thus, the slope of the graph of the etch rate with respect to pressure is positive. However, as the pressure increases from 130 mTorr to 200 mTorr, the etch rate of the silicon nitride film hardly changes, and as the pressure further increases up to 270 mTorr, the etch rate increases rapidly by about 30%.

In the manufacture of a semiconductor device such as NAND or DRAM, there is a case in which the etching selectivity of the silicon nitride film with respect to the silicon oxide film should be high. To this end, under the same conditions, the etch rate of the silicon oxide film should be as low as possible while the etch rate of the silicon nitride film should be as high as possible.

As shown in FIGS. 3 and 4, in the etching of the silicon oxide film and the silicon nitride film by the direct plasma of the etching gas containing $F_3NO$, the etch rate behaviors with respect to pressure/applied power of the silicon oxide film and the silicon nitride film are different from each other. Accordingly, the etching selectivity of the silicon nitride film with respect to the silicon oxide film may be greatly improved by adjusting the pressure and the applied power during the direct plasma generation of the etching gas containing $F_3NO$.

That is, as shown in FIG. 5, in the case of the same applied power, the etching selectivity of the silicon nitride film with respect to the silicon oxide film can be increased by increasing the pressure for the direct plasma generation of the etching gas including $F_3NO$. This is because the slope of the graph of the etch rate of the silicon nitride film with respect to pressure is positive while the slope of the graph of the etch rate of the silicon oxide film with respect to pressure is negative within the pressure range of 130 mTorr to 270 mTorr, as described above. As such, the etching selectivity can be increased as high as possible by setting the pressure condition preferably to a value greater than the median value (200 mTorr in FIGS. 3 and 5) of the pressure range in which the slope of the etch rate of the silicon nitride film with respect to pressure is positive and the slope of the etch rate of the silicon oxide film with respect to pressure is negative.

However, the present invention is not limited thereto, and although the signs of the slopes of the graphs of the etch rate with respect to pressure are the same for the silicon oxide film and the silicon nitride film, if the absolute values of the slopes of the graphs of the etch rate with respect to pressure are different for the silicon oxide film and the silicon nitride film, then the etching selectivity of the silicon nitride film with respect to the silicon oxide film may be increased by adjusting the pressure condition. For example, even when the etch rate of the silicon oxide film increases as the pressure increases, if the etch rate of the silicon nitride film increases more steeply as the pressure increases in the corresponding pressure range, the etch selectivity may be increased by setting the pressure condition to a larger value within the corresponding pressure range. In addition, if the etch rate of the silicon oxide film hardly increases as the pressure increases and the etch rate of the silicon nitride film increases as the pressure increases in the corresponding pressure range, then, the etching selectivity of the silicon nitride film with respect to the silicon oxide film may also be increased by appropriately adjusting the pressure in the corresponding pressure range.

That is, the pressure condition may be selected such that the change rates of the etch rates of the silicon nitride film and the silicon oxide film with respect to pressure are different and the etching selectivity can be maximized.

In FIGS. 3 to 5, the etching selectivity is maximized considering the slopes of the etch rates of the silicon nitride film and the silicon oxide film with respect to pressure within the exemplary pressure range of 130 mTorr to 270 mTorr, but the present invention is not limited to the exemplary pressure range (and the applied power range), and other pressure range in which the difference in the slopes of the etch rates with respect to pressure is large may be employed. For example, the pressure range may be any range capable of increasing the etching selectivity within a range of 1 mTorr to 10 Torr.

On the other hand, as the applied power for direct plasma generation increases under the same pressure condition, the etch rate of the silicon oxide film increases faster than the etch rate of the silicon nitride film. Therefore, as can be seen from FIG. 5, as the applied power for direct plasma generation is lower under the same pressure condition, the etching selectivity of the silicon nitride film with respect to the silicon oxide film increases. However, since the etch rate of the silicon nitride film decreases as the applied power increases, it is preferable to determine the applied power so that the etch rate is not excessively reduced while the etching selectivity is increased by adjusting the applied power. Although FIGS. 3 to 5 illustrate an applied power in a range of about 240 W to about 320 W, the present disclosure is not limited thereto. For example, the range of applied power may be any range capable of increasing the etching selectivity within a range of 10 W to 50,000 W.

According to an embodiment of the present invention, a semiconductor device may be manufactured on a substrate using the above-described etching method of the present invention. For example, a method of manufacturing a semiconductor device according to an embodiment of the present invention includes depositing a silicon-containing film including a silicon nitride film (a first silicon-containing film) and a silicon oxide film (a second silicon-containing film) on a substrate, and etching the silicon nitride film with a high selectivity with respect to the silicon oxide film using the etching method according to the present invention.

The invention claimed is:

1. A method for etching a silicon-containing film, comprising steps of:

introducing a substrate including a silicon nitride film and a silicon oxide film into a process chamber of an etching apparatus, supplying at least one etching gas including $F_3NO$ to the process chamber, generating a direct plasma in the process chamber by applying a predetermined power to the process chamber maintained at a predetermined pressure, and selectively etching the silicon nitride film on the substrate with respect to the silicon oxide film by radicals of the etching gas activated by the direct plasma, wherein the predetermined pressure is set to a value greater than a median value of a predetermined range in which a slope of etch rate of the silicon nitride film with respect to pressure is positive and a slope of etch rate of the silicon oxide film with respect to pressure is negative.

2. The method of claim 1, wherein the predetermined pressure ranges from 1 mTorr 10 Torr.

3. The method of claim 2, wherein the predetermined pressure ranges from 200 mTorr to 270 mTorr.

4. The method of claim 1, wherein the predetermined power ranges from 10 W to 50,000 W.

5. The method of claim 4, wherein the predetermined power ranges from 240 W to 320 W.

6. The method of claim 1, wherein the etching apparatus is a direct CCP apparatus.

7. The method of claim 1, wherein the etching gas further includes a control gas including a hydrogen atom.

8. A method for manufacturing a semiconductor device comprising steps of:

forming a silicon-containing film including a silicon nitride film and a silicon oxide film on a substrate, and etching the silicon-containing film using the method of claim 1.

9. The method of claim 1, wherein reactive species in the direct plasma generated in the process chamber consist of one or more selected from the group consisting of $F$, $F_2$, $FNO$, and $NO$.

* * * * *